(12) United States Patent
Economikos et al.

(10) Patent No.: US 6,350,692 B1
(45) Date of Patent: Feb. 26, 2002

(54) INCREASED POLISH REMOVAL RATE OF DIELECTRIC LAYERS USING FIXED ABRASIVE PADS

(75) Inventors: Laertis Economikos, Wappingers Falls; Ravikumar Ramachandran, Ossining; Alexander Simpson, Wappingers Falls, all of NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/737,198

(22) Filed: Dec. 14, 2000

(51) Int. Cl.$^7$ .............................................. H01L 21/302
(52) U.S. Cl. ...................................................... 438/692
(58) Field of Search ................... 438/784, 692

(56) References Cited

U.S. PATENT DOCUMENTS

| | | | |
|---|---|---|---|
| 5,663,107 A | | 9/1997 | Peschke et al. |
| 5,695,384 A | * | 12/1997 | Beratan ........................ 451/28 |
| 5,880,007 A | | 3/1999 | Varian et al. |
| 6,019,806 A | * | 2/2000 | Sees et al. ..................... 51/308 |
| 6,121,143 A | * | 9/2000 | Messner et al. ............. 438/692 |
| 6,136,714 A | | 10/2000 | Schutz |

* cited by examiner

*Primary Examiner*—Amir Zarabian
*Assistant Examiner*—Beth E. Owens

(57) ABSTRACT

A method for polishing a dielectric layer containing silicon provides a fluorine-based inorganic compound during a polishing process. The dielectric layer is polished in the presence of the fluorine based compound to accelerate a polishing rate of the dielectric layer.

27 Claims, 6 Drawing Sheets

INCREASED POLISH REMOVAL RATE OF DIELECTRIC LAYERS USING FIXED ABRASIVE PADS

BACKGROUND

1. Technical Field

This disclosure relates to semiconductor fabrication processes, and more particularly, to methods for increasing a removal rate of a blanket oxide formed on a semiconductor wafer using a fixed abrasive pad.

2. Description of the Related Art

Semiconductor wafers are processed by a plurality of different deposition and removal steps. One such removal process includes chemical-mechanical polishing (CMP). CMP both removes and planarizes a surface of a wafer. CMP is employed to planarize, for example, layer of dielectric material, such as, silicon dioxide. CMP processing typically includes providing a rotatable table, which includes a polish pad and a rotating wafer holder or carrier. In one type of CMP, a slurry is introduced to the polishing pad and the table and the wafer carrier are simultaneously rotated to polish a top surface of the wafer.

Other CMP processes include the use of a slurry-less process, where the abrasive element is embedded into a pad (e.g., a fixed abrasive pad). Fixed abrasive pads are very effective at reducing topological features formed on the surface of the wafer but have a very low removal rate once the topography has been removed. For example, to remove a remaining blanket silicon oxide of 800 Å, the wafer has to be polished for an additional 8 min, even though the bulk of the oxide and its topography have been removed in less than 1 min (for a high density plasma (HDP) silicon oxide deposition of, say, about 8000 Å).

Although fixed abrasive pads simplify CMP processes, the additional time needed to polish planarized layers reduces throughput. Therefore, a need exists for a method for increasing the removal rate of planarized dielectric layers when employing a fixed abrasive pad.

SUMMARY OF THE INVENTION

A method for polishing a dielectric layer containing silicon provides a fluorine-based compound during a polishing process. The dielectric layer is polished in the presence of the fluorine based compound to accelerate a polishing rate of the dielectric layer.

Another method for polishing semiconductor wafers having a dielectric layer containing silicon formed thereon includes the steps of contacting the dielectric layer with a polishing pad, providing a fluorine based compound on the polishing pad, and polishing the dielectric layer with the polishing pad in the presence of the fluorine based compound to accelerate a polishing rate of the dielectric layer. Yet another method for polishing semiconductor wafers having a dielectric layer containing silicon formed thereon, includes the steps of providing a fixed abrasive polishing pad on a polishing table, planarizing topographical features formed in the dielectric layer, adding a fluorine based compound on the polishing pad, and polishing the dielectric layer with the polishing pad in the presence of the fluorine based compound to accelerate a polishing rate for bulk removal of the dielectric layer.

In other methods, the fluorine based compound may include a salt containing fluorine. The fluorine based compound may include at least one of $NH_4F \cdot HF$ and $KHF_2$. The fluorine based compound may include $NH_4F$ in solution with an acid. The acid may include an equivalent molar concentration of $NH_4F$ in solution. The fluorine based compound may include at least one of KF and NaF with an acid. The fluorine based compound may include HF. The step of polishing may include polishing a blanket layer of silicon dioxide with a fixed abrasive pad. The method may include the step of accelerating the polishing rate by greater than 2 times over a polish rate provided by the fixed abrasive pad alone by providing the fluorine based compound. The fluorine based compound may include at least one of fluoride salts of amines, aluminum hexafluoride, and tin bifluoride.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides for the use of additives to modify a dielectric layer surface for a slurry-less chemical-mechanical polish (CMP) process to increase the removal rate of a blanket dielectric. The present invention will be illustratively described in terms of CMP of a silicon dioxide layer. The present invention is broader, however, and may be extended to other dielectric layers, which are polished by employing a fixed abrasive pad. Percentages of compounds throughout this document are given in weight percent (wt %) unless otherwise stated.

Figure 1:
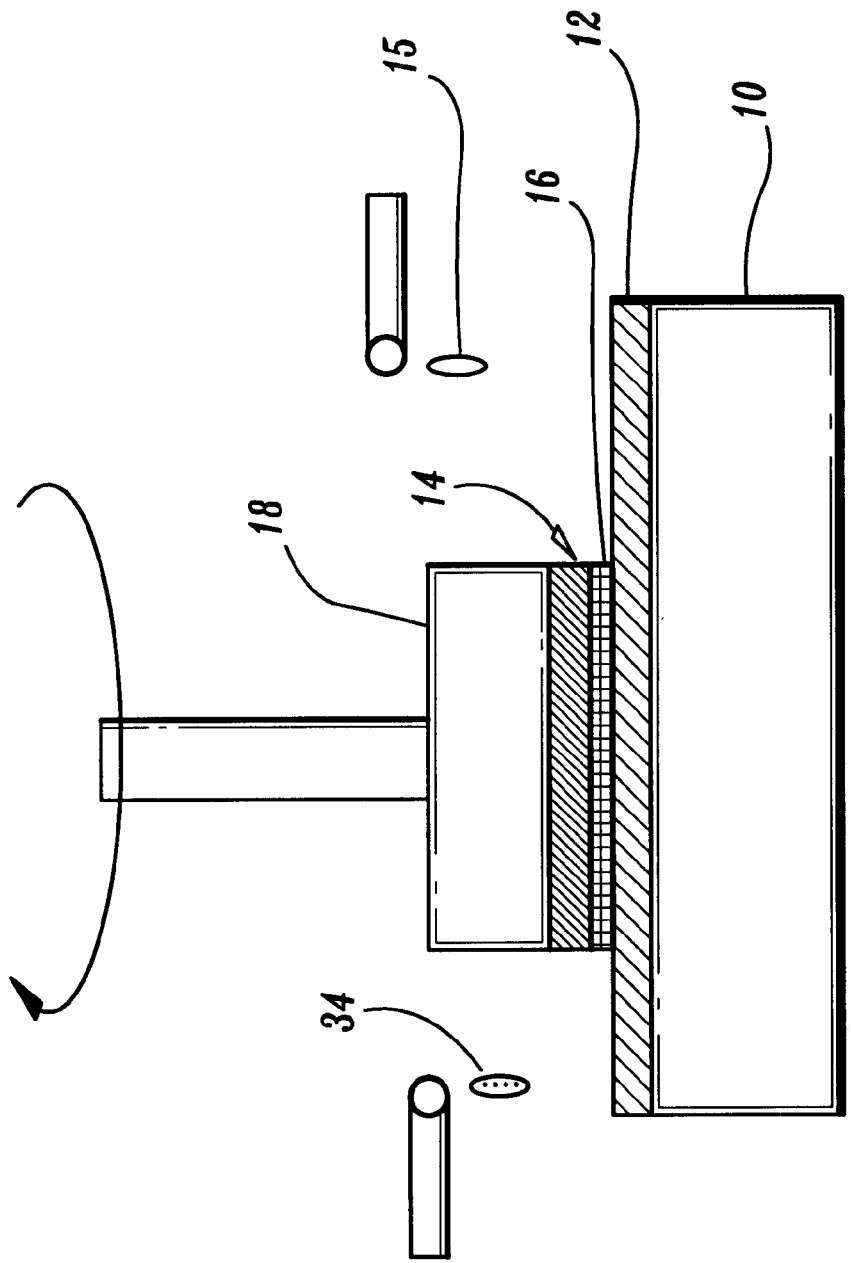
FIG. 1 is a schematic diagram showing a polishing apparatus for employing the present invention.

Referring now in specific detail to the drawings in which like reference numerals identify similar or identical elements throughout the several views, and initially to FIG. 1, a set up for performing CMP is illustratively shown. A rotatable polishing table 10 is included which supports a polishing pad 12. Polishing pad 12 preferably includes a fixed abrasive pad or a pad stack including a fixed abrasive pad. Fixed abrasive pads are known in the art, and commercially available, and may include, for example, a SWR-159 pad from 3M, Inc. Fixed abrasive pads are not employed with a slurry and instead include particular abrasives, which are released/exposed during the polishing process by the addition of, for example, aqueous solution 15. A semiconductor wafer 14 includes a dielectric layer 16 formed thereon. Layer 16 may include an oxide layer, such as a silicon dioxide layer. In one particularly useful embodiment, layer 16 includes an oxide formed by employing a high density plasma (HDP) oxide deposition process. Of course, other layers and materials may also be employed for layer 16.

A wafer carrier 18 is employed to secure wafer 14 therein. For example, wafer carrier 18 may employ a vacuum chuck for securing wafer 14. Polishing occurs by contacting layer 16 to polish pad 12 and rotating table 10 (with pad 12 fixed to table 10) and/or rotating wafer carrier 18 (with wafer 14 fixed to carrier 18). Polishing with a fixed abrasive pad may be considered in two phases: for example, a topography reduction and blanket layer polishing. The phases are illustratively described with reference to FIGS. 2 and 3, respectively.

In other embodiments with fixed abrasive pads, a fixed abrasive polish may be performed on a web format tool. In this process, polish table 10 does not rotate and wafer carrier 18 moves in an orbital motion. After wafer 14 is polished, abrasive pad 12 advances (e.g., by about 0.5 inches to about 1 inch) to bring a new section of the abrasive pad for the next wafer to polish. This designs decouples the life of the pad from the polishing process. Tools for carrying such a process are commercially available, for example, an OBSIDIAN polishing tool.

Figure 2:
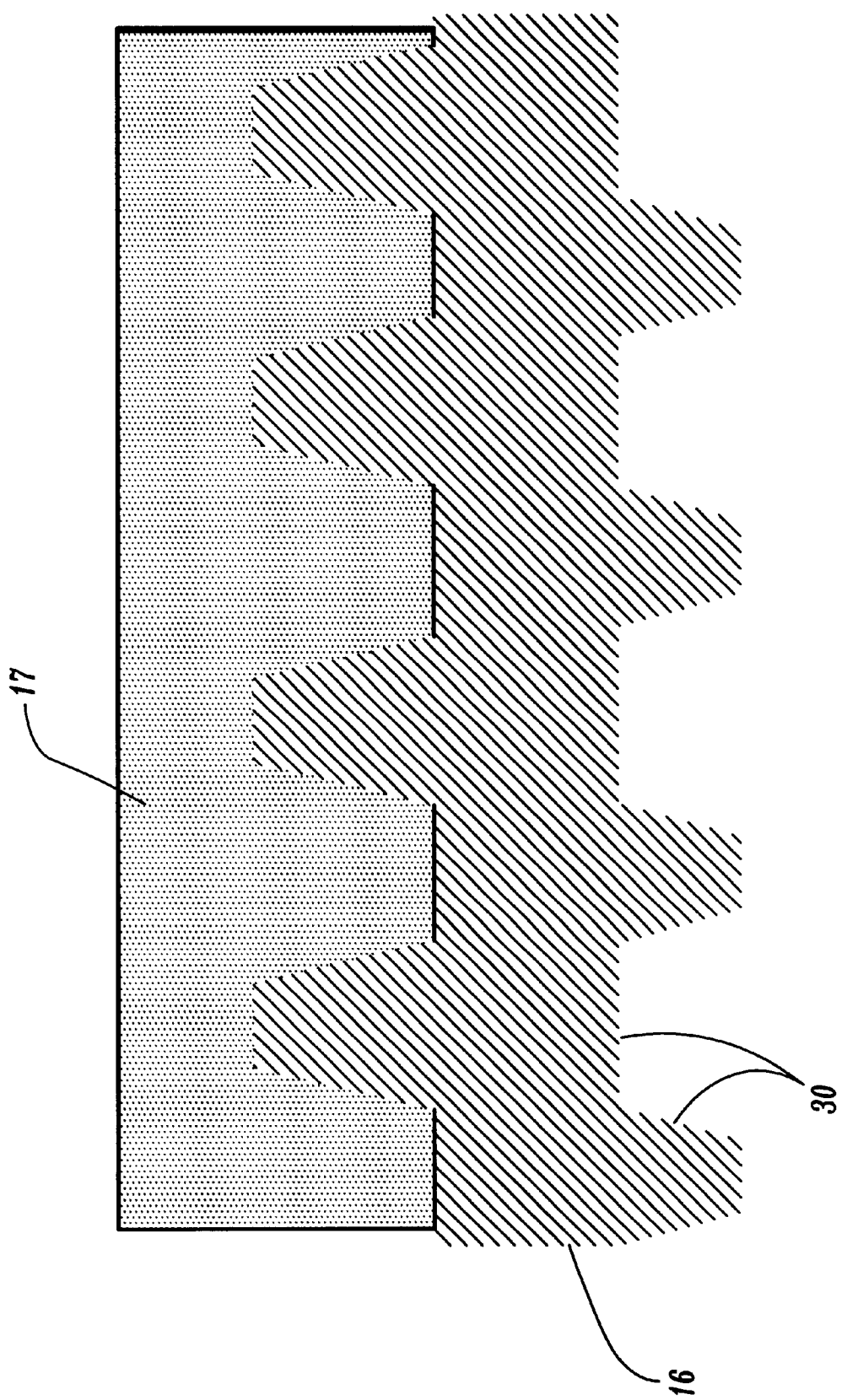
FIG. 2 is a cross-sectional view of a semiconductor wafer showing topographical features formed in a dielectric layer to be planarized in accordance with the present invention.

Referring to FIG. 2, layer 16 is shown having topographical features 30 formed thereon. Topographical features 30 include up features and down features, which are formed as a result on underlying layers and features 17 (e.g., a substrate or other layers). The polishing process attempts to planarize layer 16 to provide a flat top surface. Additives in accordance with the present invention may be added at this time, however, fixed abrasive pads are very efficient at reducing or planarizing topographical features 30, as shown in FIG. 3.

Figure 3:
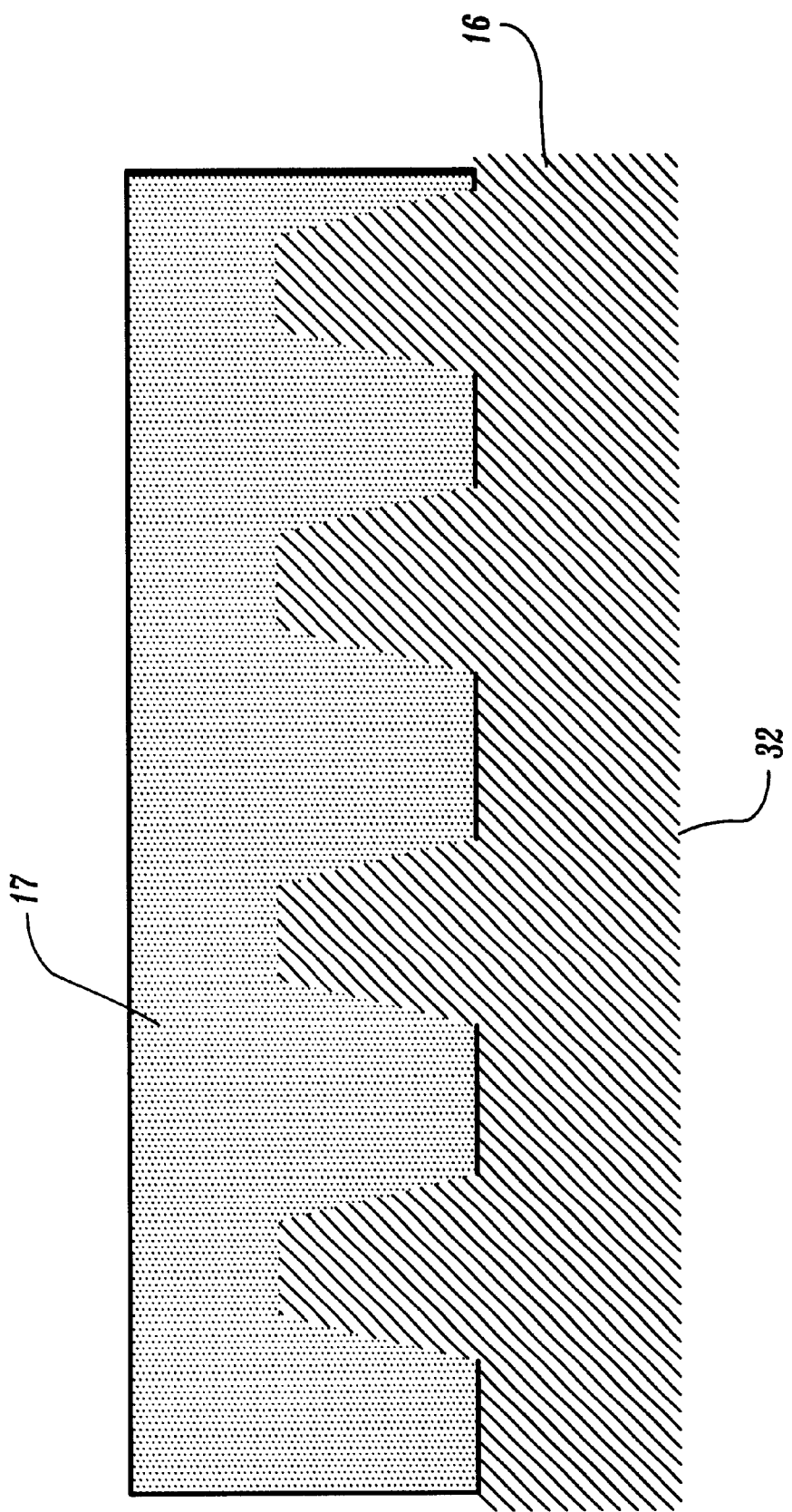
FIG. 3 is a cross-sectional view of the semiconductor wafer or FIG. 2 after the topographical features have been planarized and showing the start of bulk removal of the dielectric layer in accordance with the present invention.

Referring to FIG. 3, after reducing features 30, a blanket dielectric layer 32 remains. Fixed abrasive pads are less efficient at further removing a depth of layer 32 (e.g., bulk removal). Additives 34 containing fluorine, as will be described in greater detail below, are introduced to polish pad 12 (see FIG. 1) to increase the removal rate of layer 16. Additives 34 may be added in aqueous solution 15 from the beginning of the polish or may be added separately after the topography has been removed.

Figure 4:
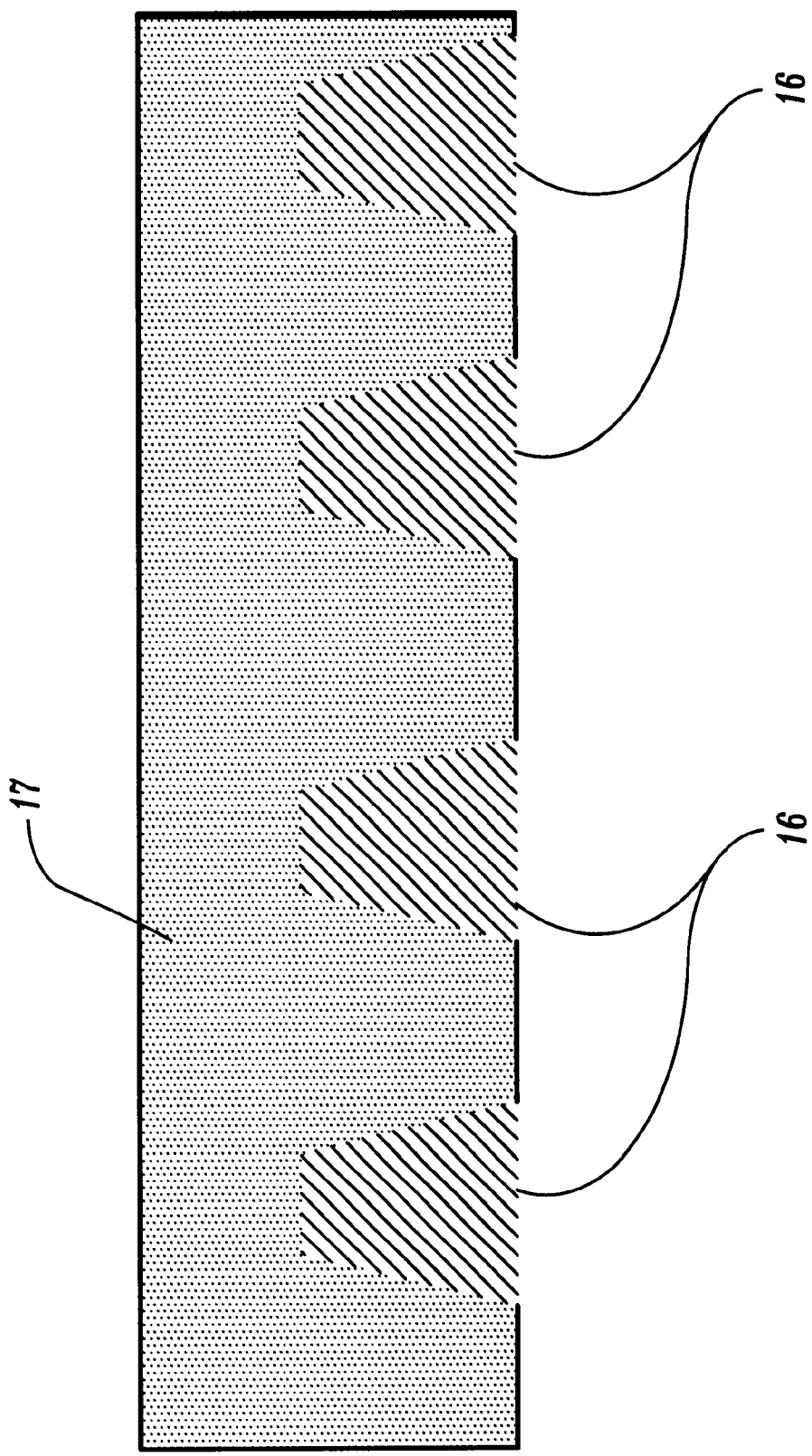
FIG. 4 is a cross-sectional view of the semiconductor wafer or FIG. 3 after the dielectric layer is completely planarized (bulk removal) in accordance with the present invention.

In a preferred embodiment, layer 16 includes oxide. For example, the oxide may be employed for shallow trench isolation filling for semiconductor memories, such as dynamic random access memories (DRAM). Other applications and materials are also contemplated. FIG. 4 illustratively shows dielectric layer 16 completely planarized down to underlying layers 17.

Oxide CMP using silica based slurries is done in a basic solution at pH levels greater than 10. The oxide undergoes protonation and deprotonation reactions, which result in the formation of different surface species, namely, the neutral [SiOH] species (this is only a representation, not the actual chemical species that is formed), the protonated [SiOH$_2^+$] species, and the deprotonated [SiO$^-$] species. The reactions for the formation of the above mentioned species can be listed as:

where $K_1$ and $K_2$ are the respective formation constants for reactions (1) and (2).

The removal rate (RR) in slurry based CMP process increases almost linearly with pH. In a slurry-less process the oxide RR increases with pH too, but the RR even at pH=12 is at least 15 times lower than that of a slurry CMP process. At pH<13, for example, the RR for a slurry-less system drops, as shown in Table I.

TABLE I

| pH | RR(Å/min) |
|---|---|
| 7 | 19 |
| 11 | 85 |
| 12 | 150 |

In the presence of fluoride ions in solution, there are additional surface reactions that take place. The surface reactions may include the following:

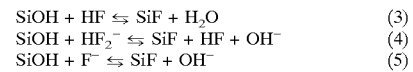

The above reactions represent the formation of a [SiF] species and also show the relative competition between both the hydroxyl ions (OH$^-$) and fluoride ions (F$^-$). As the solution pH changes, the concentration of the [SiOH] species varies. In a solution, with an increase in the pH, the concentration of [HF] decreases and [HF$_2^-$] increases.

Reactions (3) and (5) represent the competition effect between the hydroxyl ions and the fluoride ions to form the respective surface species.

For the fluoride ions, first, there is adsorption of the fluoride ions on the surface, and second is the actual dissolution reaction. A representation of the various reaction steps during the etching reaction may be given as follows:

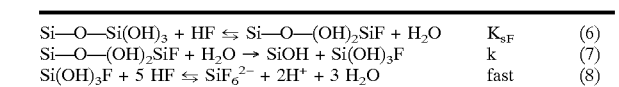

where, $K_{sF}$ is the formation constant for the surface fluoride species (log $K_{sF} \leq 6$), and k is the rate constant for Reaction (7). The detachment reaction is the rate-determining step in the actual etching process (e.g., reaction (7)) and the overall etching rate (ER) is then given by:

$$ER = K^* C_{fa} \quad (9)$$

where the second term, $C_{fa}$, is the surface concentration of the fluoride species. Table II includes a list of bond energies with other atoms for the Si(111) surface.

TABLE II

| Bond energies for a Si(111) surface | | | | | |
|---|---|---|---|---|---|
| Bond | Si—Si | Si—H | Si—F | Si—Cl | Si—O |
| D(kJ mol$^{-1}$) | 340 | 393 | 565 | 381 | 452 |

The thermodynamic stability of the various species in solution can be determined by constructing a Pourbaix (Eh-pH) diagram, as is known in the art. Recently, Osseo-Asare et al. in an article published in *J. Electrochem. Soc.*, Vol. 143, No. 2, pp. 749–751 (1996), constructed the Eh-pH diagram for the Si—F—$H_2O$ system. Such a diagram is useful in understanding the conditions under which silicon dioxide would dissolve in solution.

Figure 5:
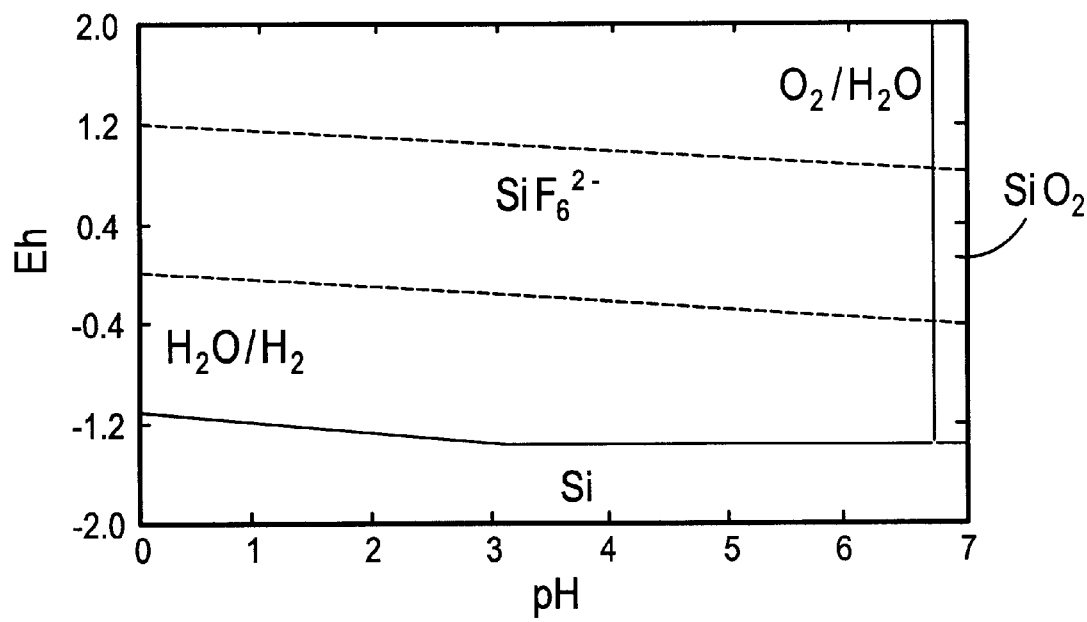
FIG. 5 is an Eh-pH diagram for a Si—F—$H_2O$ system at 25 degrees C. with a fluorine concentration of 1 M.
Figure 6:
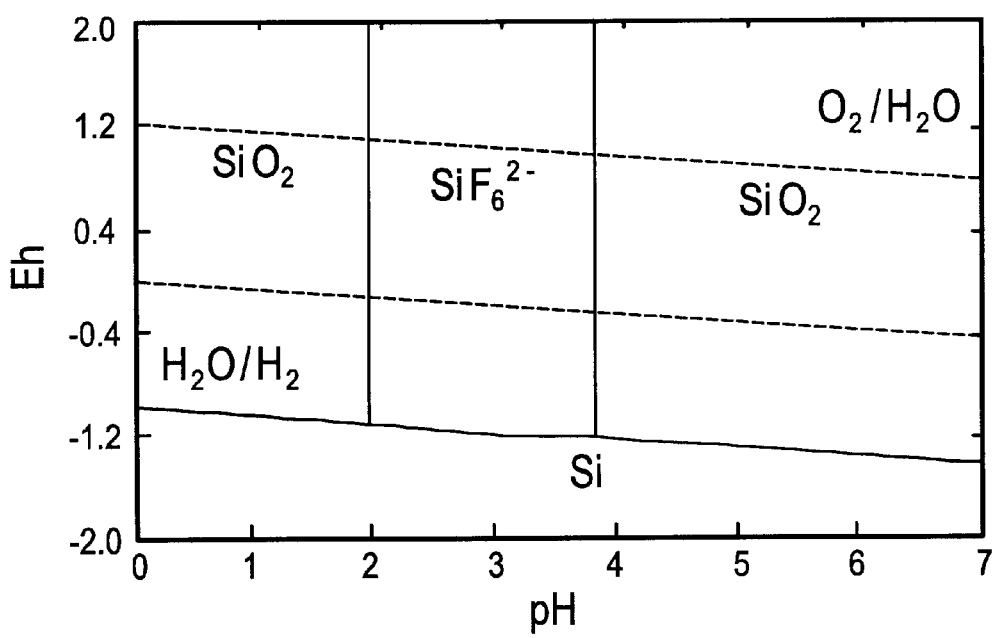
FIG. 6 is an Eh-pH diagram for a Si—F—$H_2O$ system at 25 degrees C. with a fluorine concentration of 0.01 M.

FIGS. 5 and 6 represent the Eh-pH stable fields for the various chemical species. The y-axis Eh represent an oxidative (+) or reductive (−) potential, while the x-axis represents pH. FIG. 5 shows an Eh-pH diagram for the Si—F—$H_2O$ system at 25° C. ([Si]=$10^{-3}$ M, [F]=1 M). FIG. 6 show an Eh-pH diagram for the Si—F—$H_2O$ system at 25° C. ([Si]=$10^{-3}$ M, [F]=$10^{-2}$ M). From FIG. 5, the dissolution region for silicon dioxide extends to pHs less than 7. However, when the fluoride ion concentration is reduced from about 1 M (as in FIG. 5) to about 0.01 M (as in FIG. 6), a much smaller window exists for the dissolution between the pHs 2 and 3.5 (see FIG. 6).

In accordance with the present invention, a low concentration source of fluorine ions (e.g., between about 0.01 M to about 1.0 M) are added to a CMP pad to accelerate the polishing rate. The low concentration of fluorine ions provides a low etch rate, but advantageously, provides a polish rate of between 4 to 5 times greater than with a polishing pad alone. The additives are acid based and provide a dramatic increase in bulk removal of silicon oxides, silicon nitrides, silicon oxy-nitrides, silicon oxide-silicon nitride-silicon oxide (ONO), silicate glasses, and other dielectric layers. Since OSHA standards for HF are at 3 ppm, precautions need to be taken to prevent contact with humans if higher concentrations are used.

In one illustrative example of the present invention, for a slurry-less CMP system with less than 0.5% $NH_4F.HF$, the molar concentrations are: [$NH_4F.HF$]=87.7 mM, [HF]=30.7 mM, [$NH_4F$]=57 mM, [F]=[$NH_4F$]=57 mM, [$HF_2$]=16.7 mM. For this example, $NH_4F.HF$ was added to a water solution. To consider the bulk etching properties of such a solution, an equivalent system including $KHF_2$ (KF.HF) is considered in FIG. 6.

Figure 7:
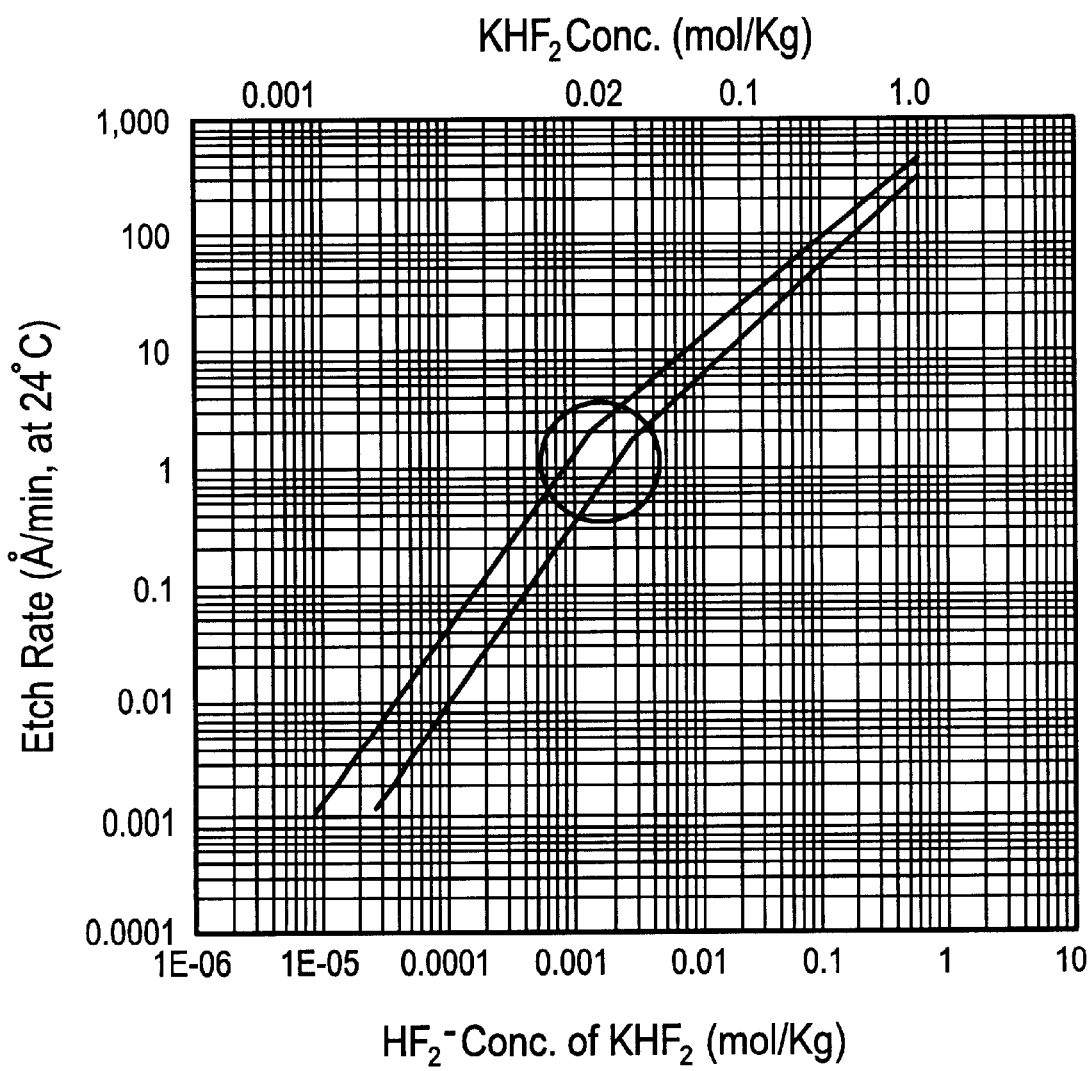
FIG. 7 is a log-log plot of etch rate versus $KHF_2$ concentration as a point of comparison to a polish rate achieved by the present invention.

Referring to FIG. 7, the etch rate of silicon dioxide at room temperature in a $KHF_2$ solution is shown as reported by H. Kikuyama, et al. in *J. Electrochem Soc.*, Vol. 141, No. 2, pp. 366–374 (1994). FIG. 7 shows the relationship between etching rate (at 24 degrees C.) and $HF_2^-$ concentration of $KHF_2$ solution. The silicon dioxide etch rate is reported to be less than 30 Å/min for $KHF_2$ concentration of 100 mM. In other systems, the polish rate obtained with pH 11 (e.g., 1 mM of [$OH^-$]) is approximately 100 Å/min, and pH 12 (10 mM of [$OH^-$]) is 150 ÅA/min. Although fluorine based acids provide a small amount of etching, surprisingly, a very high polish rate can be achieved with fluorine species of the present invention. In accordance with the present invention, with approximately 60 mM of [$F^-$], the polish rate is approximately increased to a dramatic 500 Å/min! This is about 5 times greater than the polish rate of high pH CMP polishes.

It is assumed that the surface modification of a silicon oxide through the adsorption of fluoride containing species and the formation of a [Si—F] species on the surface, leads to a substantial enhancement of the polish rates in a slurry-less process. For example, a slurry-less shallow trench isolation (STI) polish of a structure with step height of approximately 7000 Å, the polish time will be reduced from about 10 minutes for the prior art to less than about 2.5 minutes in accordance with the present invention.

In accordance with the invention, a plurality of different fluorine sources may be included in an additive to increase polish rate. These fluorine sources may include fluoroboric acid, fluoride salts of amines (for example, H is replaced by aliphatic groups, giving rise to primary, secondary and tertiary amine compounds), aluminum hexafluoride, tin bifluoride, or other salts or compounds may be employed with water to provide F ions, HF and/or $HF^-$ ions. Examples of other salts may include $KHF_2$ and/or $NH_4F.HF$ (ammonium bifluoride). Assuming ammonium bifluoride is employed, concentrations of between about 0.01 wt % to about 10.0 wt % would be effective, with 0.1% to 5.0%, as a preferred range and about 0.5% to about 1.0% in aqueous solution as an illustrative operating point. In another embodiment, $NH_4F$ may be employed with strong acid of equivalent molar concentration of $NH_4F$ in solution. Strong acids may include hydrochloric acid, sulfuric acid, etc. In another embodiment, $NH_4F$ may be employed with a weak acid, such as, acetic acid. KF and/or NaF may also be employed with either strong or weak acids. HF may also be employed to increase the polish rate in accordance with the present invention. Other fluorine containing materials are also contemplated and within the scope of the present invention. Also, combinations of the above compounds may be employed in accordance with the present invention.

Having described preferred embodiments for increased polish removal rate of dielectric layers using fixed abrasive pads (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for polishing a dielectric layer containing silicon, comprising the steps of:

providing a fluorine based compound on a surface of the dielectric layer, the fluorine based compound being an inorganic compound and dispensed on the surface in solution; and polishing the dielectric layer in the presence of the fluorine based compound to accelerate a polishing rate of the dielectric layer.

2. The method as recited in claim 1, wherein the fluorine based compound includes a salt containing fluorine.

3. The method as recited in claim 2, wherein the fluorine based compound includes at least one of $NH_4F.HF$ and $KHF_2$.

4. The method as recited in claim 1, wherein the fluorine based compound includes $NH_4F$ in solution with an acid.

5. The method as recited in claim 4, wherein the acid includes an equivalent molar concentration of $NH_4F$ in solution.

6. The method as recited in claim 1, wherein the fluorine based compound includes a t least one of KF and NaF with an acid.

7. The method as recited in claim 1, wherein the fluorine based compound includes HF.

8. The method as recited in claim 1, wherein the step of polishing includes polishing a blanket layer of silicon dioxide with a fixed abrasive pad.

9. The method as recited in claim 8, further comprising the step of accelerating the polishing rate by greater than 2 times over a polish rate provided by the fixed abrasive pad alone by providing the fluorine based compound.

10. A method for polishing semiconductor wafers having a dielectric layer containing silicon formed thereon, comprising the steps of:

contacting the dielectric layer with a polishing pad;

providing a fluorine based compound on a surface of the dielectric layer, the fluorine based compound being an inorganic compound and dispensed to the surface in solution; and polishing the dielectric layer with the polishing pad in the presence of the fluorine based compound to accelerate a polishing rate of the dielectric layer.

11. The method as recited in claim 9, wherein the fluorine based compound includes a salt containing fluorine.

12. The method as recited in claim 11, wherein the fluorine based compound includes at least one of $NH_4F \cdot HF$ and $KHF_2$.

13. The method as recited in claim 9, wherein the fluorine based compound includes $NH_4F$ in solution with an acid.

14. The method as recited in claim 13, wherein the acid includes an equivalent molar concentration of $NH_4F$ in solution.

15. The method as recited in claim 9, wherein the fluorine based compound includes at least one of KF and NaF with an acid.

16. The method as recited in claim 9, wherein the polishing pad includes a fixed abrasive pad and the step of polishing includes polishing a blanket layer of silicon dioxide.

17. The method as recited in claim 16, further comprising the step of accelerating the polishing rate greater than 2 times over a polish rate provided by the fixed abrasive pad alone by providing the fluorine based compound.

18. The method as recited in claim 9, wherein the fluorine based compound includes at least one of fluoride salts of amines, aluminum hexafluoride, and tin bifluoride.

19. A method for polishing semiconductor wafers having a dielectric layer containing silicon formed thereon, comprising the steps of:

providing a fixed abrasive polishing pad on a polishing table;

planarizing topographical features formed in the dielectric layer;

after the planarizing step, adding a fluorine based compound on the polishing pad; and polishing the dielectric layer with the polishing pad in the presence of the fluorine based compound to accelerate a polishing rate for bulk removal of the dielectric layer.

20. The method as recited in claim 19, wherein the fluorine based compound includes a salt containing fluorine.

21. The method as recited in claim 20, wherein the fluorine based compound includes at least one of $NH_4F \cdot HF$ and $KHF_2$.

22. The method as recited in claim 19, wherein the fluorine based compound includes $NH_4F$ in solution with an acid.

23. The method as recited in claim 22, wherein the acid includes an equivalent molar concentration of $NH_4F$ in solution.

24. The method as recited in claim 19, wherein the fluorine based compound includes at least one of KF and NaF with an acid.

25. The method as recited in claim 19, wherein the step of polishing includes polishing a blanket layer of silicon dioxide for bulk removal of the silicon dioxide.

26. The method as recited in claim 25, further comprising the step of accelerating the polishing rate greater than 2 times over a polish rate provided by the fixed abrasive pad alone by providing the fluorine based compound.

27. The method as recited in claim 19, wherein the fluorine based compound includes at least one of fluoride salts of amines, aluminum hexafluoride, and tin bifluoride.

* * * * *